United States Patent
Furukawa et al.

(10) Patent No.: US 6,444,402 B1
(45) Date of Patent: Sep. 3, 2002

(54) METHOD OF MAKING DIFFERENTLY SIZED VIAS AND LINES ON THE SAME LITHOGRAPHY LEVEL

(75) Inventors: Toshiharu Furukawa, Essex Junction, VT (US); Mark C. Hakey, Fairfax, VT (US); Steven J. Holmes, Milton, VT (US); David V. Horak, Essex Junction, VT (US); William H-L. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/532,187

(22) Filed: Mar. 21, 2000

(51) Int. Cl.⁷ ............................................. G03C 5/00
(52) U.S. Cl. ................ 430/313; 430/312; 430/314; 430/316; 430/317; 430/318
(58) Field of Search ................ 430/312, 313, 430/314, 316, 317, 318

(56) References Cited

U.S. PATENT DOCUMENTS

| | | | |
|---|---|---|---|
| 4,387,145 A | 6/1983 | Lehrer et al. ................ 430/5 |
| 4,497,684 A | 2/1985 | Sebesta ................ 216/13 |
| 4,519,872 A | 5/1985 | Anderson, Jr. et al. ...... 438/623 |
| 4,533,624 A | 8/1985 | Sheppard ................ 430/312 |
| 4,699,870 A | * 10/1987 | Iwadate et al. ............... 430/296 |
| 4,814,258 A | 3/1989 | Tam ............................ 430/315 |
| 5,091,288 A | 2/1992 | Zappella et al. ............. 430/311 |
| 5,496,666 A | 3/1996 | Chu et al. ........................ 430/5 |
| 6,248,664 B1 | * 6/2001 | Saha et al. .................. 438/652 |
| 6,303,272 B1 | * 10/2001 | Furukawa et al. ........... 430/314 |

FOREIGN PATENT DOCUMENTS

JP 56-21328 2/1981

* cited by examiner

Primary Examiner—Mark F. Huff
Assistant Examiner—Saleha R. Mohamedulla
(74) Attorney, Agent, or Firm—Jay H. Anderson; Whitham, Curtis & Christofferson, P.C.

(57) ABSTRACT

Features of two or more distinct sizes designed to optimize performance of an integrated circuit device are formed by transferring a pattern from a resist patterned with features of a single minimum feature size for which a resist exposure tool is optimized to a layer of preferably soluble material such as germanium oxide. Portions of this pattern are then enlarged using a block-out mask and the resulting pattern transferred to a further underlying layer preferably using an anisotropic reactive ion etch. The soluble material can then be removed leaving a robust mask with differing feature sizes for further processing. Preferably, Damascene conductive lines and vias are formed by providing an insulator as the further underlying material and filling the openings with metal or other conductive material.

8 Claims, 2 Drawing Sheets

METHOD OF MAKING DIFFERENTLY SIZED VIAS AND LINES ON THE SAME LITHOGRAPHY LEVEL

BACKGROUND OF THE INVENTION

1. Field of the Invention

The present invention generally relates to the manufacture of semiconductor integrated circuits and modules and, more particularly, to the formation of structures therein which enhance signal propagation and improve performance of such devices.

2. Description of the Prior Art

It has long been recognized that increases in integration density provide significant performance enhancements and increased chip functionality as well as manufacturing economy in integrated circuits. Accordingly, many advances have been achieved in lithographic processes in order to reduce the minimum feature sizes which define the electronic elements of such devices. The minimum feature sizes now possible and foreseeable, however, require optimization of the lithographic exposure tool to compensate for various physical effects which are unavoidable such as exposure dose variation due to scattering of photons or electrons within the resist. Therefore, it is very difficult, if not impossible, to accurately produce features of different sizes in the same resist or lithographic level consistent with high integration density.

Nevertheless, optimum performance and integration density of integrated circuits often cannot be achieved without provision of elements, including conductors of differing sizes, each adapted to the specific function of that element, such as current capacity, thermal conduction and the like. For example, transistors used to precharge circuits to provide increased switching response speed may be fabricated at much smaller sizes than switching transistors having even modest fanout drive capability. The cross-sectional area of conductors (whether vias or lines) can have a substantial effect, through effects of its resistance and capacitance, on the signal propagation time through the conductor as well as thermal performance to remove heat from active devices.

Such optimization through change of size of elements, however, cannot generally be performed in a single lithographic level or device layer without substantially increased difficulty, process complexity or potential loss in manufacturing yield, as alluded to above. Formation of differently sized devices in different layers or at different lithographic levels increases conductor length (reducing performance) and number of process steps (increasing cost and tool overhead) while possibly compromising manufacturing yield.

It is theoretically possible to make compensations for lithographic patterning of features of increased feature size using an exposure tool optimized for a smaller minimum feature size. However, a different compensation, including a relatively large number of interrelated parameters must be calculated, approximated or extrapolated for each larger size desired and often provides irregular or unpredictably non-uniform results. Therefore, return on such additional costs is highly unpredictable and may result in large losses of manufacturing yield.

It is also theoretically possible to develop differently sized features in a single layer with different lithographic processes and differently optimized tools. However, at high integration densities, alignment of exposures is especially critical and difficult to reliably achieve with different tools or a single tool operated with different sets of optimized parameters. Much the same is true for seeking to develop larger features from multiple exposures of smaller shapes which greatly increases total lithographic exposure time as may be compromised by incorrect stitching together of the smaller shapes. Again, process cost and complexity is increased and manufacturing yield may be compromised.

Accordingly, at the present state of the art, no process is available to allow reliable production of features of sizes differing in sufficient degree to allow performance optimization consistent with currently possible and foreseeable minimum feature sizes in integrated circuit designs. Therefore, a trade-off between cost and manufacturing yield and near-optimal performance has been unavoidable at high integration densities and imposes a practical limit on integration density in integrated circuits.

SUMMARY OF THE INVENTION

It is therefore an object of the present invention to provide a method of reliably producing lithographic features of differing sizes in the same lithographic level consistent with optimization of exposure tools to produce currently possible and foreseeable feature sizes in order to improve and/or enhance performance of integrated circuit designs fabricated therewith.

It is another object of the invention to provide reliably manufacturable, maximal density, integrated circuits capable of enhanced performance by virtue of having features of different sizes in the same lithographic level or device layer.

In order to accomplish these and other objects of the invention, a method of fabricating a semiconductor device is provided including steps of patterning a resist to form a first mask pattern, transferring the first mask pattern to an underlying layer of material, block-out masking a portion of the resist, modifying a portion of the first mask pattern transferred to the underlying layer of material in accordance with the block-out masking to form a second mask pattern, transferring the second mask pattern to a further underlying layer of material to form openings therein, and completing the semiconductor device.

In accordance with another aspect of the invention, a lithography mask is provided by a process including steps of patterning a resist to form a first mask pattern, transferring the first mask pattern to an underlying layer of material, block-out masking a portion of the resist, and modifying a portion of the first mask pattern transferred to the underlying layer of material in accordance with the block-out masking to form a second mask pattern.

In accordance with a further aspect of the invention, a semiconductor device is provided including a first feature of a first size in a layer thereof, the first size being a minimum feature size in the layer, and a second feature of a second size larger than the first size in the same layer of the semiconductor device.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
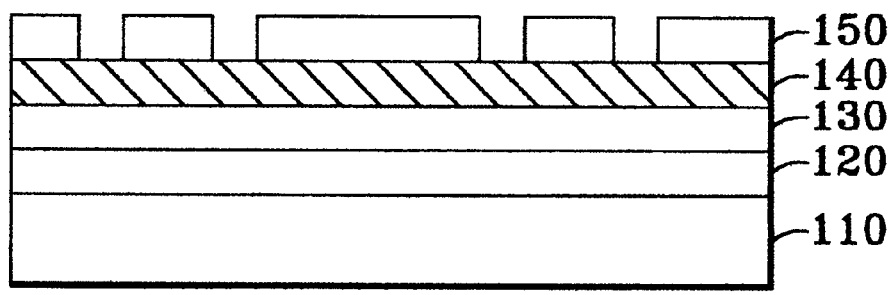
FIG. 1 is a cross-sectional view of an initial stage of a preferred technique for provision of images of differing feature sizes in the same lithographic level of an integrated circuit in accordance with the invention.

Referring now to the drawings, and more particularly to FIG. 1, there is shown, in cross-sectional view, an initial stage in a process in accordance with the invention. It should be understood that while only a single back end of line (BEOL) insulator layer is shown, for clarity, the invention is applicable to any layer of any material of any semiconductor integrated circuit device design. It should also be understood that the invention essentially provides a mask with differently sized features which heretofore could only be produced with low reliability and much increased difficulty and cost.

The mask so provided in accordance with the invention can be used with other known processes for formation of any semiconductor device structure (e.g. doped regions of transistors) although it is considered by the inventors as particularly advantageous in the production of connection lines and vias, especially of the damascene type which characteristically are mechanically robust and of high dimensional regularity. Therefore, depending on the structures being formed in or on the BEOL layer in accordance with an arbitrary integrated circuit design, it is also substantially irrelevant which, if any, layers of the mask are further removed or left in the device in accordance with the design thereof.

The process and mask in accordance with the invention begins with a wafer of any type (e.g. monocrystalline silicon, silicon on insulator (SOI) and the like) 110 with a "BEOL layer in progress" 120 formed (e.g. deposited, grown, implanted, etc.) thereon. This layer is referred to as a "BEOL layer in progress" principally to indicate that it is ultimately the layer to be affected by other processes performed later in accordance with the mask provided by the invention.

Particularly since the present invention is considered particularly advantageous for formation of conductors and vias, a layer 130 of BEOL insulator is provided over the BEOL layer. Oxide, tetra ethyl orthosilicate (TEOS), nitride, polyimide, spin-on glass and the like are suitable materials for the BEOL insulator layer which may be freely chosen in accordance with the device design (e.g. required dielectric constant, coefficient of thermal expansion, etc.). The BEOL insulator layer is preferably followed by a germanium oxide layer 140. Germanium oxide is particularly preferred in view of its crystalline structure and resulting highly predictable solubility characteristics in water.

However, it should be understood that other materials with well-understood solubility or differential etch rate characteristics in various solvents could also be used as long as processes exist which are mutually selective thereto and to the BEOL insulator and BEOL layer and provide good predictability of etch or solution rate and resulting surface characteristics. Germanium oxide is exemplary of a material exhibiting such properties. Examples of other suitable combinations of materials are polysilicon over oxide and nitride over oxide.

As further shown in FIG. 1, a resist layer 150 is applied and patterned in accordance with any process appropriate to the particular resist material and the desired exposure medium (e.g. deep ultraviolet light, x-rays, electron beam and the like). It should be noted that all apertures illustrated in the patterned resist are of substantially the same size (within the accuracy and repeatability of the exposure tool) which will, generally and in the preferred application of the invention, correspond to the minimum feature size for the current layer of the design.

Figure 2:
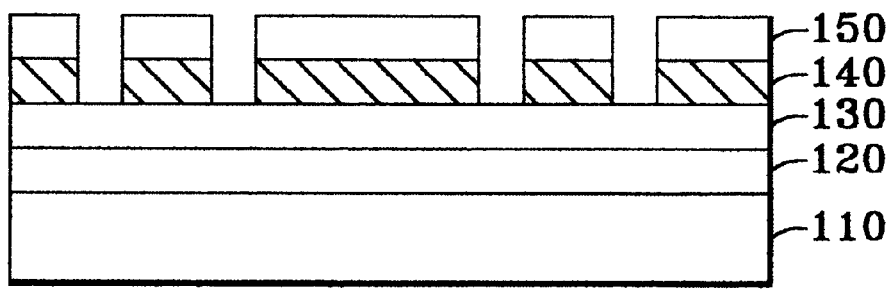
FIGS. 2, 3 and 4 are cross-sectional views of intermediate stages in production of a mask having differently sized features.
Figure 3:
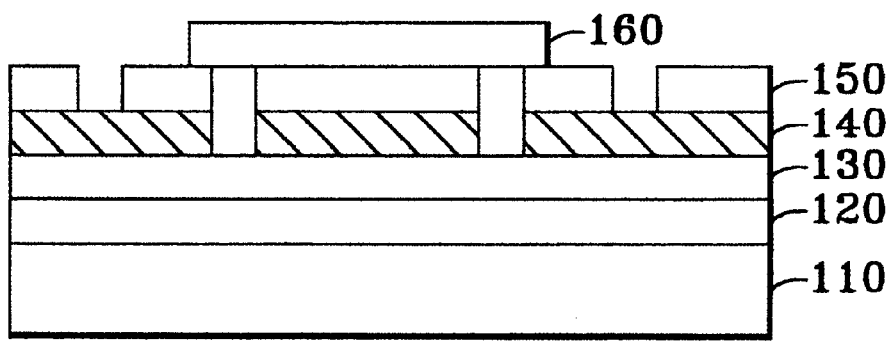

As shown in FIG. 2, the pattern of the resist 150 is transferred to the germanium oxide layer 140, preferably by reactive ion etching (RIE) which is selective between the germanium oxide and the BEOL insulator material 130 so that the process is self-limiting. This etch process is preferably anisotropic or substantially so to improve pattern transfer accuracy. Then, as shown in FIG. 3, a block-out mask 160 is applied to cover (and, preferably, fill) the portions of the pattern which are to remain at the minimum feature size while exposing portions of the pattern where larger features are to be formed.

Figure 5:
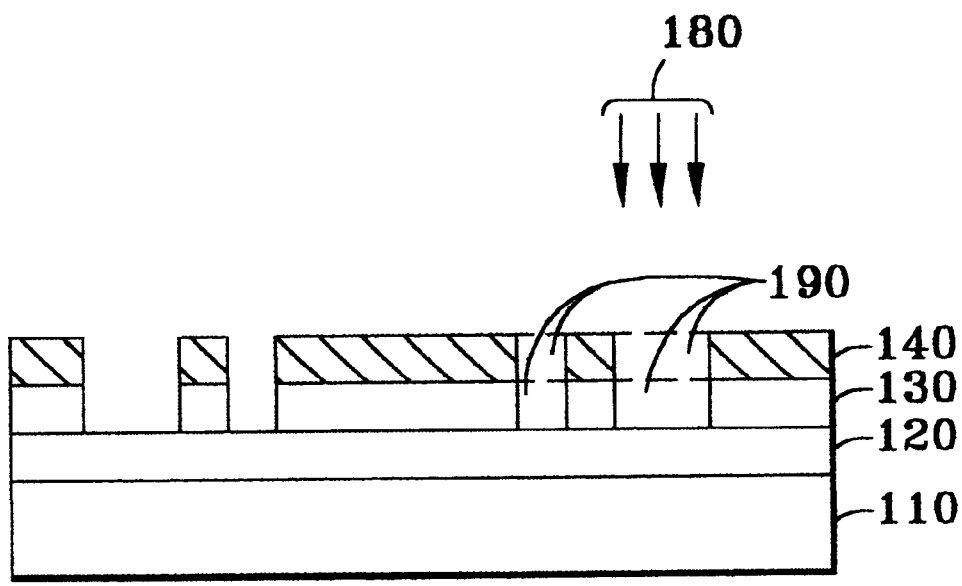
FIG. 5 shows a cross-sectional view of a completed mask on a wafer in accordance with the invention and ready for further processing to form a layer of an integrated circuit.

It should be appreciated that registration of a block-out mask is substantially less critical than other masking arrangements such as for separately forming separate structures of differing sizes. It is also often the case that the nature of the circuits of an integrated circuit design will dictate that features of common size will be grouped together or can easily be arranged to do so. Further, it is seldom required to form features of different sizes less than a multiple of the minimum feature size; further reducing criticality of block-out mask registration. Then, as shown in FIG. 5, the features which are not protected by the block-out mask are enlarged by dissolving or etching germanium oxide exposed by the patterned resist 150 and the block-out mask 160 as shown at 170.

It should be appreciated that it is not necessary to the practice of the invention that dissolution occur to the exclusion of etching in this process. As is well-understood, the process of dissolving a material, particularly from a crystalline or polycrystalline solid proceeds somewhat slowly and in proportion of the relative saturation of the solvent while the solute atoms tend to diffuse relatively rapidly through the available volume of solvent.

Etching, on the other hand, may be characterized (for purposes of understanding the invention) as producing a chemical reaction which removes atoms from the crystalline structure of a material. Further, wet etch processes may be grain boundary sensitive while dry etch processes typically are not. While solution of germanium oxide in water is preferred for practice of the invention, other processes and combinations of processes will be evident to those skilled in the art in view of this discussion of the invention since the characteristics of materials in regard to solvents and etchants therefor are well-known to those skilled in the art.

Figure 4:
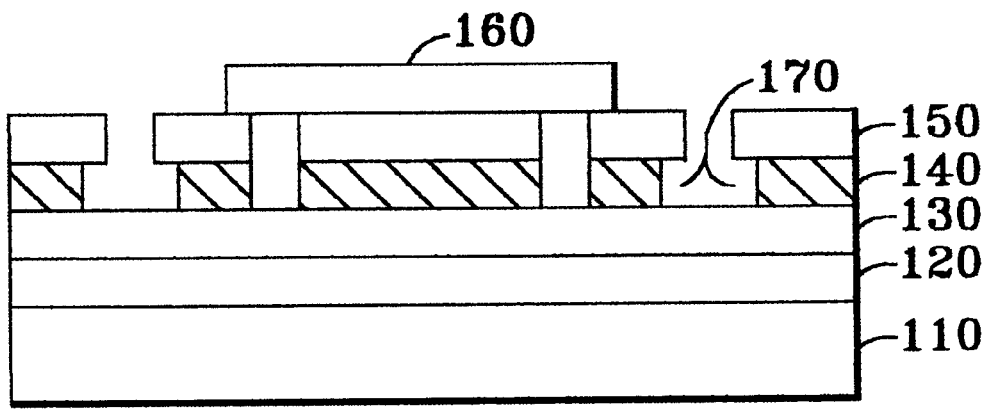

While often somewhat slower, the dissolution process is also more controllable and predictable than etching while being less affected by the qualities of the affected material. Accordingly, it is preferred that dissolution should predominate over or be at least comparable in rate of progress with etching during the process depicted in FIG. 4. Thus, carrying out the process in a timed manner is sufficient to the successful practice of the invention.

As shown in FIG. 5, the block-out mask 160 and resist layer 150 are now removed and a reactive ion etch (RIE) of the BEOL insulator is preferably performed selectively to the BEOL layer 120 in a self-limited manner to transfer the pattern of germanium oxide mask pattern (which now includes pattern areas of two distinct sizes) to the BEOL insulator. It should be noted that this process is preferably chosen to be anisotropic or substantially so to improve pattern transfer accuracy.

Once the BEOL insulator 130 is patterned through to the BEOL in progress layer 120, the remainder of the germanium oxide layer 140 may be removed preferably by dissolution in water (unless it can otherwise be beneficially employed in the device design) and a mask comprising the patterned BEOL insulator layer 130 having openings of differing sizes will remain for further processing of BEOL in progress layer 120. Such further processing can include, for example, implantation with dopant as shown at 180 which may then be diffused by known techniques, as desired, etching of trenches (as would be depicted similarly or to a greater depth) and/or filling with metal or other material and polishing back to the surface of the BEOL insulator to form conductive lines and/or vias as depicted at 190 with dashed lines.

As indicated above, the damascene vias and/or conductors provided in accordance with the invention have superior mechanical and electrical properties and are thus the preferred application of the invention. Nevertheless, the use of the patterned BEOL mask formed in accordance with the invention can provide transistors of radically differing dimensions in the same layer as may be employed in precharge type logic and storage arrays. By the same token, storage capacitors of different values or differently sized isolation structures may also be provided by etching trenches of differing widths using the insulator mask formed in accordance with the invention. Different ones or combinations of these and/or other processes may be selectively performed at different openings in the insulator mask by using block-out masks much in the manner described above. Further, depending on the device design, the BEOL insulator mask may be left in place (as would be the case for formation of conductive lines and vias) or removed for further processing of the BEOL layer in progress layer 120.

In view of the foregoing, it is seen that the invention provides a convenient, reliable and simple technique of developing differently sized features at the same lithographic layer. All that is required is the provision of a preferably soluble layer and at least one block-out mask together with one additional pattern transfer step in order to develop two different feature sizes. By the same token, the invention allows the material of the BEOL insulator layer to be more freely chosen and may result in greater process flexibility as well as device reliability. Three or more distinct sizes may be developed in a similar manner by using two or more block-out masks 160. By the same taken, more nearly optimal performance of integrated circuits fabricated with reduced process complexity and improved manufacturing yield may be obtained through provision of differently sized features in a single layer or lithographic level;consistent with and complementing increased integration density.

While the invention has been described in terms of a single preferred embodiment, those skilled in the art will recognize that the invention can be practiced with modification within the spirit and scope of the appended claims.

What is claimed is:

1. A method of fabricating a semiconductor device including steps of patterning a resist to form a first mask pattern, transferring said first mask pattern to an underlying layer of material, block-out masking a portion of said first mask pattern, modifying a portion of said first mask pattern transferred to said underlying layer of material by removing material of said underlying layer in accordance with said block-out masking to form a second mask pattern, transferring said second mask pattern to a further underlying layer of material to form openings therein, and completing said semiconductor device using said openings in said further underlying layer.

2. A method as recited in claim 1, wherein said underlying layer of material has a preferential selective etch or solution rate for an etchant or solvent with respect to said further underlying layer of material.

3. A method as recited in claim 1, including a further step of removing a remainder of said underlying layer.

4. A method as recited in claim 1, wherein said further underlying layer is an insulator, said method including further steps of filling said openings in said further underlying layer of material with a conductive material.

5. A method as recited in claim 1, wherein said openings in said further underlying layer of material form a second mask.

6. A method as recited in claim 1, wherein said underlying material is germanium oxide and wherein said step of modifying said first pattern is performed by dissolving said germanium oxide in water.

7. A method as recited in claim 1, wherein said step of modifying a portion of said first mask pattern removes material of said underlying layer in a direction parallel to a surface of said underlying layer.

8. A method as recited in claim 1, wherein said block out masking step masks a portion of said resist.

* * * * *